United States Patent
Cao et al.

(10) Patent No.: US 11,283,416 B2
(45) Date of Patent: Mar. 22, 2022

(54) LOADLINE SWITCHABLE PUSH/PULL POWER AMPLIFIER

(71) Applicant: SKYWORKS SOLUTIONS, INC., Irvine, CA (US)

(72) Inventors: Yuan Cao, Milpitas, CA (US); Yu-Jui Lin, Westlake Village, CA (US); Bo Pan, Irvine, CA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 52 days.

(21) Appl. No.: 16/537,744

(22) Filed: Aug. 12, 2019

(65) Prior Publication Data
US 2020/0052660 A1    Feb. 13, 2020

Related U.S. Application Data

(60) Provisional application No. 62/718,141, filed on Aug. 13, 2018.

(51) Int. Cl.
| | |
|---|---|
| *H03F 1/56* | (2006.01) |
| *H03F 3/21* | (2006.01) |
| *H04B 1/00* | (2006.01) |
| *H04B 1/04* | (2006.01) |

(52) U.S. Cl.
CPC .............. *H03F 1/565* (2013.01); *H03F 3/21* (2013.01); *H04B 1/0067* (2013.01); *H04B 1/04* (2013.01); *H03F 2200/09* (2013.01); *H03F 2200/387* (2013.01); *H03F 2200/451* (2013.01)

(58) Field of Classification Search
CPC .................................................... H03F 1/565
See application file for complete search history.

(56) References Cited

U.S. PATENT DOCUMENTS

| | | | |
|---|---|---|---|
| 6,388,539 B1 | 5/2002 | Rice | |
| 9,900,204 B2* | 2/2018 | Levesque | H03F 1/0261 |
| 2004/0095190 A1 | 5/2004 | Klaren et al. | |
| 2009/0273397 A1* | 11/2009 | Bockelman | H03F 1/0277 330/51 |
| 2010/0093292 A1 | 4/2010 | Kim et al. | |
| 2010/0327969 A1* | 12/2010 | Jung | H03F 1/56 330/124 R |
| 2011/0260797 A1* | 10/2011 | Lee | H03F 3/211 330/295 |
| 2011/0299433 A1* | 12/2011 | Darabi | H04B 1/525 370/277 |
| 2013/0314162 A1 | 11/2013 | Schmidt | |
| 2015/0050901 A1* | 2/2015 | Lee | H03F 1/0277 455/127.3 |

(Continued)

FOREIGN PATENT DOCUMENTS

KR    10-2010-0041536 A    4/2010

OTHER PUBLICATIONS

International Search Report and Written Opinion from corresponding International Application No. PCT/US2019/046151 dated Dec. 6, 2019.

*Primary Examiner* — Patricia T Nguyen
(74) *Attorney, Agent, or Firm* — Lando & Anastasi, LLP

(57) ABSTRACT

Systems and methods are provided herein that include an amplifier arrangement and a balun arrangement that accommodate two or more frequency bands using various common components that are operated and/or coupled in differing ways based upon which frequency band is in operation.

25 Claims, 6 Drawing Sheets

(56) References Cited

U.S. PATENT DOCUMENTS

| | | | |
|---|---|---|---|
| 2015/0070097 A1* | 3/2015 | Bauer | H03F 1/0261 |
| | | | 330/296 |
| 2015/0303875 A1* | 10/2015 | Borodulin | H03F 3/189 |
| | | | 330/295 |
| 2017/0077984 A1 | 3/2017 | Esmaeilzadeh Najari et al. | |
| 2018/0175798 A1* | 6/2018 | Cabanillas | H04B 1/0483 |
| 2018/0212574 A1* | 7/2018 | Ko | H03F 1/0216 |
| 2020/0274495 A1* | 8/2020 | Ren | H03F 3/45188 |

* cited by examiner

LOADLINE SWITCHABLE PUSH/PULL POWER AMPLIFIER

CROSS-REFERENCE TO RELATED APPLICATIONS

This application claims priority under 35 U.S.C. § 119(e) to U.S. Provisional Patent Application Ser. No. 62/718,141 titled LOADLINE SWITCHABLE PUSH/PULL POWER AMPLIFIER, filed Aug. 13, 2018, which is incorporated by reference herein in its entirety.

BACKGROUND

Evolution in wireless communications has resulted in the demand for devices capable of supporting multiple frequency bands. Each frequency band generally has differing coding, modulation, frequency, channel, and power requirements. Each frequency band may have varying performance requirements and conventionally may require varying amplifier, matching network, balanced-to-unbalanced (BALUN) conversion, and/or antenna characteristics, requiring more components that take up more space, limiting size reductions of devices, and increasing costs. Conventional approaches to consolidating support for multiple bands result in compromised solutions that may lead to significantly reduced performance in one or more bands.

SUMMARY

Aspects and embodiments are directed to systems and methods of accommodating two or more frequency bands using various common components that are operated and/or coupled in differing ways based upon which frequency band is in operation.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

According to one aspect, an amplifier system is provided and includes at least one common amplifier stage having an input to receive a radio-frequency signal and to provide a common amplified radio-frequency signal, a first amplifier stage having an input to receive the common amplified radio-frequency signal during a first mode of operation and to provide a first amplified radio-frequency signal, a second amplifier stage having an input to receive the common amplified radio-frequency signal during a second mode of operation and to provide a second amplified radio-frequency signal, a signal coupler having at least one first input to receive the first amplified radio-frequency signal from the first amplifier stage during the first mode of operation and at least one second input to receive the second amplified radio-frequency signal from the second amplifier stage during the second mode of operation.

In various embodiments, the signal coupler is configured to provide the first amplified radio-frequency signal to a common output of the signal coupler during the first mode of operation and to provide the second amplified radio-frequency signal to the common output during the second mode of operation.

In some embodiments, the first amplified radio-frequency signal is a balanced signal and the at least one first input of the signal coupler includes a first contact and a second contact to receive the first amplified radio-frequency signal. In some embodiments, the second amplified radio-frequency signal is a balanced signal and the at least one second input of the signal coupler includes a third contact and a fourth contact to receive the second amplified radio-frequency signal. In certain embodiments, the at least one first input of the signal coupler presents a first impedance to the first amplifier stage and the at least one second input of the signal coupler presents a second impedance to the second amplifier stage, the second impedance being different than the first impedance.

In various embodiments, the signal coupler provides the first and second amplified radio-frequency signals to the common output as unbalanced signals. In some embodiments, the amplifier system includes a first matching network coupled to the common output.

In various embodiments, the amplifier system includes a switch having an input and a plurality of outputs, the plurality of outputs including at least a first output and a second output, wherein the first matching network is coupled between the common output and the input of the switch. In some embodiments, the amplifier system includes a second matching network coupled to the second output of the switch, wherein the input of switch is selectively coupled to the first output of the switch during the first mode of operation, and wherein the input of the switch is selectively coupled to the second output of the switch and the second matching network during the second mode of operation.

In certain embodiments, the first and second amplifier stages are selectively enabled based on the mode of operation.

According to another aspect, an amplifier system is provided and includes a first amplifier stage to provide a first balanced signal during a first mode of operation, the first balanced signal having a first frequency in a first frequency band, a second amplifier stage to provide a second balanced signal during a second mode of operation, the second balanced signal having a second frequency in a second frequency band, and a signal coupler to receive the first balanced signal and the second balanced signal, to convert the first balanced signal to a first unbalanced signal during the first mode of operation, and to convert the second balanced signal to a second unbalanced signal during the second mode of operation.

In certain embodiments, the first frequency band and the second frequency band are non-overlapping.

In various embodiments, the amplifier system includes at least one common amplifier stage, coupled to the first amplifier stage and the second amplifier stage, to provide a radio frequency signal to the first amplifier stage and the second amplifier stage during the first mode of operation and the second mode of operation.

In some embodiments, the signal coupler includes a first input having a first contact and a second contact to receive the first balanced signal and to present a first impedance to the first amplifier stage. In some embodiments, the signal coupler includes a second input having a third contact and a fourth contact to receive the second balanced signal and to present a second impedance to the second amplifier stage, the second impedance being different than the first impedance. In various embodiments, the signal coupler is configured to provide the first unbalanced signal to a common output of the signal coupler during the first mode of operation and to provide the second unbalanced signal to the common output during the second mode of operation.

In some embodiments, the amplifier system includes a first matching network coupled to the common output. In various embodiments, the amplifier system includes a switch having an input and a plurality of outputs, the plurality of outputs including at least a first output and a second output, wherein the first matching network is coupled between the common output and the input of the switch. In certain embodiments, the amplifier system includes a second matching network coupled to the second output of the switch, wherein the input of the switch is selectively coupled to the first output of the switch during the first mode of operation, and wherein the input of the switch is selectively coupled to the second output of the switch and the second matching network during the second mode of operation.

In certain embodiments, the first and second amplifier stages are selectively enabled based on the mode of operation.

According to another aspect, a method for controlling an amplifier system having an input and an output is provided. The method includes receiving a signal at the input, amplifying the signal in at least one common amplifier stage to produce an amplified signal, further amplifying, in a first amplifier stage, the amplified signal during a first mode of operation to provide a first balanced signal to a first input of a signal coupler, further amplifying, in a second amplifier stage, the amplified signal during a second mode of operation to provide a second balanced signal to a second input of the signal coupler, the second amplifier stage being different than the first amplifier stage, and converting, via the signal coupler, the first balanced signal to a first unbalanced signal during the first mode of operation and the second balanced signal to a second unbalanced signal during the second mode of operation.

In various embodiments, the method includes adjusting an output impedance of the signal coupler at a common output by a first amount and providing one of the first and second unbalanced signals from the common output to at least one switched output of a plurality of switched outputs. In some embodiments, the method includes providing the first unbalanced signal to a first switched output of the plurality of switched outputs during the first mode of operation and switchably providing the second unbalanced signal to a second switched output of the plurality of switched outputs during the second mode of operation.

In certain embodiments, the method includes adjusting the output impedance of the signal coupler at the common output by a second amount by providing an additional impedance at the second switched output.

In some embodiments, the method includes disabling the second amplifier stage during the first mode of operation and disabling the first amplifier stage during the second mode of operation.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures may be represented by a like numeral. For purposes of clarity, not every component may be labeled in every figure. In the figures.

DETAILED DESCRIPTION

Figure 1:
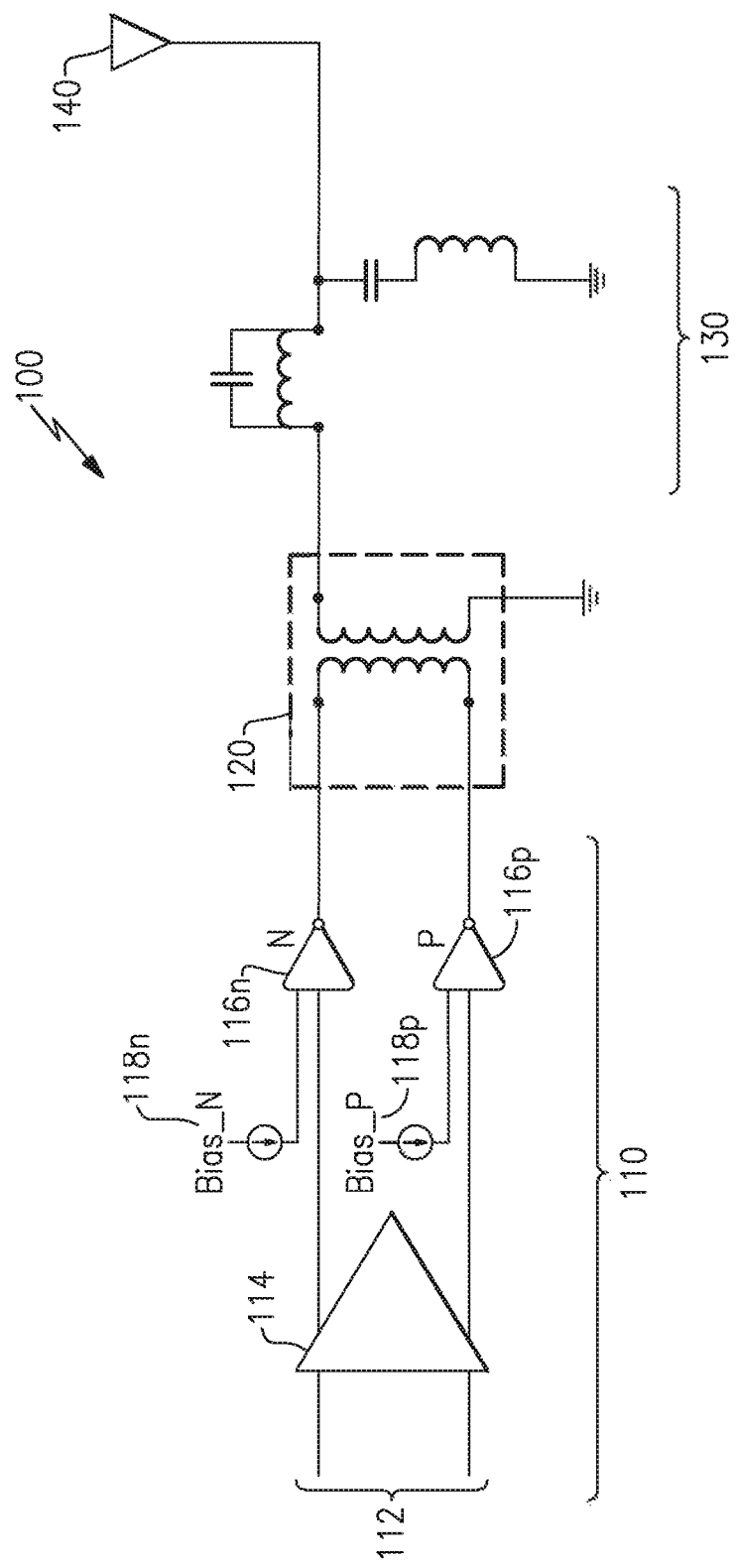
FIG. 1 is a schematic diagram of a radio frequency power amplifier arrangement for wireless transmission.

Various wireless devices operate in multiple frequency bands to provide communications capability in accord with various wireless transmission standards. Differing frequency bands may have differing power requirements, bandwidth requirements, and the like. Accordingly, conventional multi-band devices may include multiple power amplifiers, e.g., a different power amplifier for each frequency band, as well as accordant balun couplers/converters, matching networks (e.g., impedance matching networks), and antenna switching components.

Systems and methods in accord with those described herein provide an amplifier arrangement and a balun arrangement that accommodate two or more frequency bands using various common components that are operated and/or coupled in differing ways based upon which frequency band is in operation. The systems and methods described herein may further accommodate a common output matching network. Accordingly, various amplifier and balun arrangements in accord with those described herein provide multi-band capability with fewer components than conventional designs and/or with improved performance over operational modes of conventional designs.

For example, a dual-band device may support two frequency bands, each in a differing mode of operation. At least one example of a dual-band device may include a cellular wireless device, such as a smart phone, that supports second generation (2G) wireless standards and also supports fourth generation (4G) long term evolution (LTE) wireless standards. The 2G wireless standards may allow, or require, higher output transmission power from the device than do the 4G LTE wireless standards. Additionally, the 2G band may accommodate two power levels and the 4G LTE band may accommodate three power levels. Conventional designs for operation in each of the 2G and 4G LTE modes require two separate amplifiers, each on a different die (a 2G die and a 4G die), with separate balun and matching networks, and accordant switching components to selectively connect these differing hardware components to one or more antennas. In other conventional designs, a single power amplifier may be made to accommodate both frequency bands by limiting output power or making other design compromises such that the amplifier exhibits enhanced performance in one of the modes or frequency bands but is hampered in the other. Again, differing baluns and matching networks, with accordant switching components, may be required in such conventional single-amplifier designs.

Systems and methods in accord with those described herein include an amplifier having some components common to each of multiple modes of operation (e.g., in differing frequency bands or conforming to different performance requirements and/or standards) and some components dedicated to each of the modes, along with a balun design that allows for enhanced coupling to an unbalanced output regardless of which of the multiple modes of operation are active. Further, the amplifier and balun arrangements described herein may accommodate a single output matching network (for provision of the unbalanced signal to an antenna and/or an antenna switch) regardless of which of the multiple modes of operation are active. In some embodiments, an additional matching section may be selectively coupled to the output to enhance performance in one or more of the modes of operation.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, end, side, vertical and horizontal, and the like, are intended for convenience of description, not to limit the present systems and methods or their components to any one positional or spatial orientation.

FIG. 1 illustrates a system 100 that includes an amplifier 110 coupled to a balun 120 that further couples to an output matching network (OMN) 130 that further couples to and feeds a signal to an antenna 140. The system 100 is an example of an arrangement to provide an amplified transmit signal to an antenna, e.g., the antenna 140. In various embodiments, additional components may be included, such as an antenna switch that may selectively couple the antenna 140 to differing components (e.g., a receiver amplifier) or may selectively couple the amplified transmit signal to other antennas, for example.

The amplifier 110 may be a multi-stage differential push/pull amplifier having a differential input 112, one or more initial stages 114, and an output stage 116. FIG. 1 illustrates both sides, e.g., differential sides, of the output stage 116, e.g., as "positive" amplifier 116p and "negative" amplifier 116n. In various embodiments, any of one or more initial stages 114 will also include "positive" and "negative" sides despite the lack of their express illustration in the figures. In various embodiments, the amplifier 110 may be of differing types and may not be of a differential design. The output stage 116 also includes one or more bias supplies 118 that provide bias current to the output stage 116. The balun 120 is a signal coupler that provides conversion and coupling of the differential balanced output of the amplifier 110 to an unbalanced character. The matching network 130 provides coupling and impedance matching of the unbalanced amplified transmit signal to the antenna 140, optionally via an antenna switch (not shown in FIG. 1).

Figure 2:
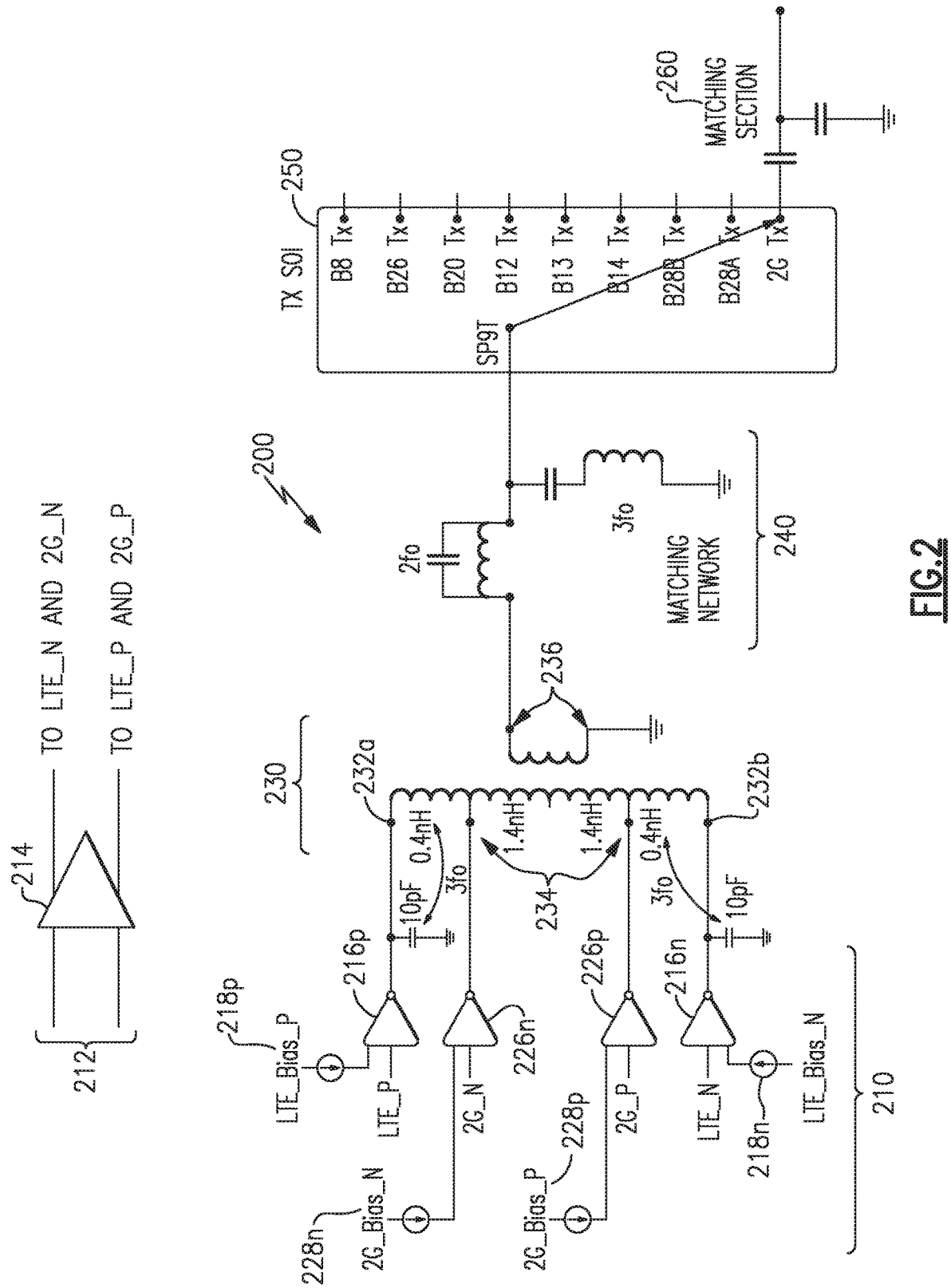
FIG. 2 is a schematic diagram of an example dual-band radio frequency power amplifier arrangement for wireless transmission.

FIG. 2 illustrates a system 200 similar to the system 100 but arranged for dual modes of operation, e.g., within differing frequency bands and/or differing standards for performance characteristics. The system 200 includes a multi-stage amplifier 210, a multi-input balun 230, and an output matching network 240. The system 200 may optionally include a switch 250 and an optional selectable matching section 260, in various embodiments.

The amplifier 210 may include multiple stages, similar to the amplifier 110 of FIG. 1 above, each of which at least partially amplify a signal prior to reaching a "final" output stage. The amplifier 210 also includes a plurality of output stages, one for each of a plurality of modes of operation. Each output stage may be associated with a mode of operation, and each mode of operation may be associated with a frequency band and/or performance standard. For example, the amplifier 210, as shown, includes two output stages. A first output stage 216 for operation in, e.g., an LTE mode, and a second output stage 226 for operation in, e.g., a 2G mode. The first output stage 216 and the second output stage 226 may each receive an amplified signal from a shared common stage 214 having a differential input 212. Each of the output stages 216, 226 are, in this example, differential amplifier output stages. Accordingly, each of the first output stage 216 and the second output stage 226 include a "positive" side and a "negative" side. For instance, the amplifier portion 216p is the positive side amplifier for the, e.g., LTE mode, and the amplifier portion 216n is the negative side. Similarly, the amplifier portions 226p and 226n are the positive and negative sides, respectively, for the, e.g., 2G mode. Additionally, each of the amplifier portions 216p, 216n, 226p, 226n may have a respective bias supply 218, 228.

In various embodiments, the amplifier 210 may be switched between multiple modes by enabling or disabling the appropriate output stage 216, 226 in accord with a desired mode of operation. For example, the system 200 may be operated in 2G mode by enabling the 2G bias 228 and disabling the LTE bias 218. The system 200 may be operated in LTE mode by enabling the LTE bias 218 and disabling the 2G bias 228. Any bias for a particular amplifier component may be selectively enabled or disabled by, e.g., a switching element that selectively connects a bias supply to a bias input, or selectively enabling or disabling a bias supply, or other means.

In accord with the above, various stages of the amplifier 210 may be common to multiple modes of operation. For example, the amplifier 210 may include multiple stages that process a transmit signal regardless of which mode the transmit signal belongs to, e.g., regardless of whether the transmit signal is a 2G signal or an LTE signal. Additionally, the amplifier 210 may have various stages that are specific to one or more modes. For example, as illustrated in FIG. 2, the amplifier 210 may have a first output stage 216 and a second output stage 226 and each may accommodate a differing mode of operation as described above. In various embodiments, a multi-stage amplifier for multi-mode operation, such as the amplifier 210, may include differing stages that are common to two or more modes and differing stages that are dedicated to one or another of various modes. In various embodiments, all components of the amplifier 210 may be incorporated onto a single die. Accordingly, the amplifier 210 may be a single die amplifier that provides enhanced performance for each of two or more modes of operation, e.g., by selectively enabling or disabling various components of the amplifier 210. In some embodiments, the amplifier may support a first mode of operation by disabling a particular component and may support a second mode of operation by enabling the particular component, e.g., the amplifier may include a component that is dedicated to a particular mode of operation while all other components are common to each of the various modes of operation. In other words, while the amplifier 210 illustrated in FIG. 2 includes two output stages 216, 226, each of which is dedicated to one of two modes of operation, other embodiments may include one or more components dedicated to a first mode of operation that are disabled when operating in a second mode of operation, the second mode of operation not requiring any dedicated components. Further, as discussed above, various embodiments may support additional modes of operation by including various components that may be selectively enabled or disabled in various combinations to support each of the modes of operation.

The multi-input balun 230 accommodates a plurality of modes of operation (e.g., frequency bands, performance standards) by accommodating signal inputs at a plurality of nodes (e.g., contacts), as described in greater detail below with respect to FIG. 3. The balun 230 is a signal coupler that provides conversion and coupling of the differential balanced outputs of the amplifier 210 to an unbalanced character. In various embodiments, the balun 230 is a passive component that does not require switching or active configuration control to accommodate operation in one mode over another. For example, the balun 230 accommodates a first, e.g., LTE, mode of operation by virtue of receiving the LTE signal at a first set of nodes 232 (or input contacts), and accommodates a second, e.g., 2G, mode of operation by virtue of receiving the 2G signal at a second set of nodes 234 (or input contacts). Accordingly, coupling and matching characteristics of the balun 230 may be different for signals received on the first set of nodes versus the second set of nodes, and the balun 230 may thereby be designed to provide appropriate coupling and matching characteristics for two (or more) modes of operation (e.g., frequency bands or other signal characteristics). The balun 230 may convert a differential balanced signal received on one of the first and second sets of nodes to produce a single-ended unbalanced signal at a common output 236.

In various embodiments, the amplifier 210 may accommodate additional modes of operation (e.g., more than two) by including additional output stages. In various embodiments, the balun 230 may accommodate additional modes of operation (e.g., more than two) by including additional sets of nodes. In various embodiments, some sets of nodes of the balun 230 may be designed to provide acceptable performance for each of two or more modes of operation and/or some output stages of the amplifier 210 may be designed to provide acceptable performance for each of two or more modes of operation. Accordingly, in some embodiments, an amplifier may provide a differing number of output stages than there are sets of nodes on a balun, e.g., one set of nodes on a balun may be connected to multiple output stages of an amplifier in some embodiments, and one output stage of an amplifier may be connected to multiple sets of nodes of a balun in some embodiments.

The output matching network 240 may be designed and arranged to provide a dual-band impedance match to an antenna (not shown) and may thereby accommodate two (or more) modes of operation without requiring active selection or switching. In some embodiments, impedance matching for two (or more) modes of operation may be enhanced or provided, at least in part, by virtue of the distinct sets of nodes (e.g., 232, 234) of the balun 230 providing differing input impedance, e.g., as seen from the amplifier 210. In some embodiments, further enhancement to an impedance match in one or more of the modes of operation may be accommodated by including an additional matching section, such as the matching section 260, that may be selectively coupled to the output of the matching network 240 (e.g., by the switch 250). Accordingly, in some embodiments, the system 200 may include the matching section 260 and may selectively decouple the matching section 260 to operate in a first mode of operation and may selectively couple the matching section 260 to operate in a second mode of operation. Various embodiments may include other matching sections for the first mode of operation and/or various other matching sections for various additional modes of operation.

FIG. 2 includes some example component values that are not intended to be limiting. The various component values shown may be suitable for a particular pair of modes of operation in some embodiments, but other embodiments may include different values to accommodate varying system requirements and/or performance characteristics.

Figure 3:
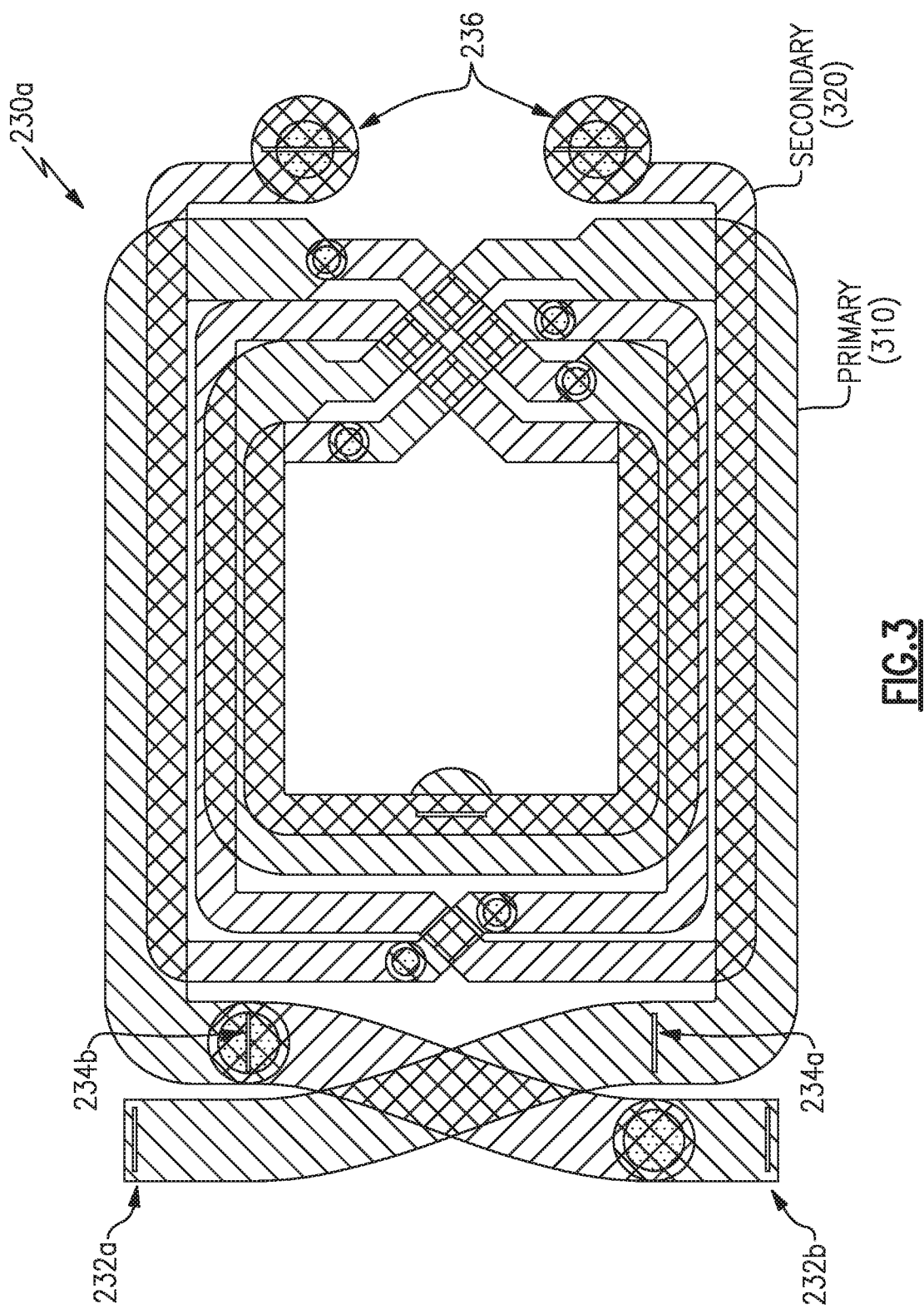
FIG. 3 is a schematic diagram of an example of a dual-mode balun converter for coupling balanced signal input to unbalanced signal output.

FIG. 3 illustrates at least one example of a multi-input balun 230a. The balun 230a includes a primary section 310 and a secondary section 320. The primary section 310 receives a transmit signal at one of a first set of inputs 232 or a second set of inputs 234, and electromagnetically couples the transmit signal to the secondary section 320 to provide an output signal at an output 236. For example, the first set of inputs 232, including 232a and 232b, may be coupled to outputs of the output stage 216 that support the first, e.g., LTE, mode of operation, and the second set of inputs 234, including 234a and 234b, may be coupled to outputs of the output stage 226 that support the second, e.g., 2G, mode of operation.

Figure 4:
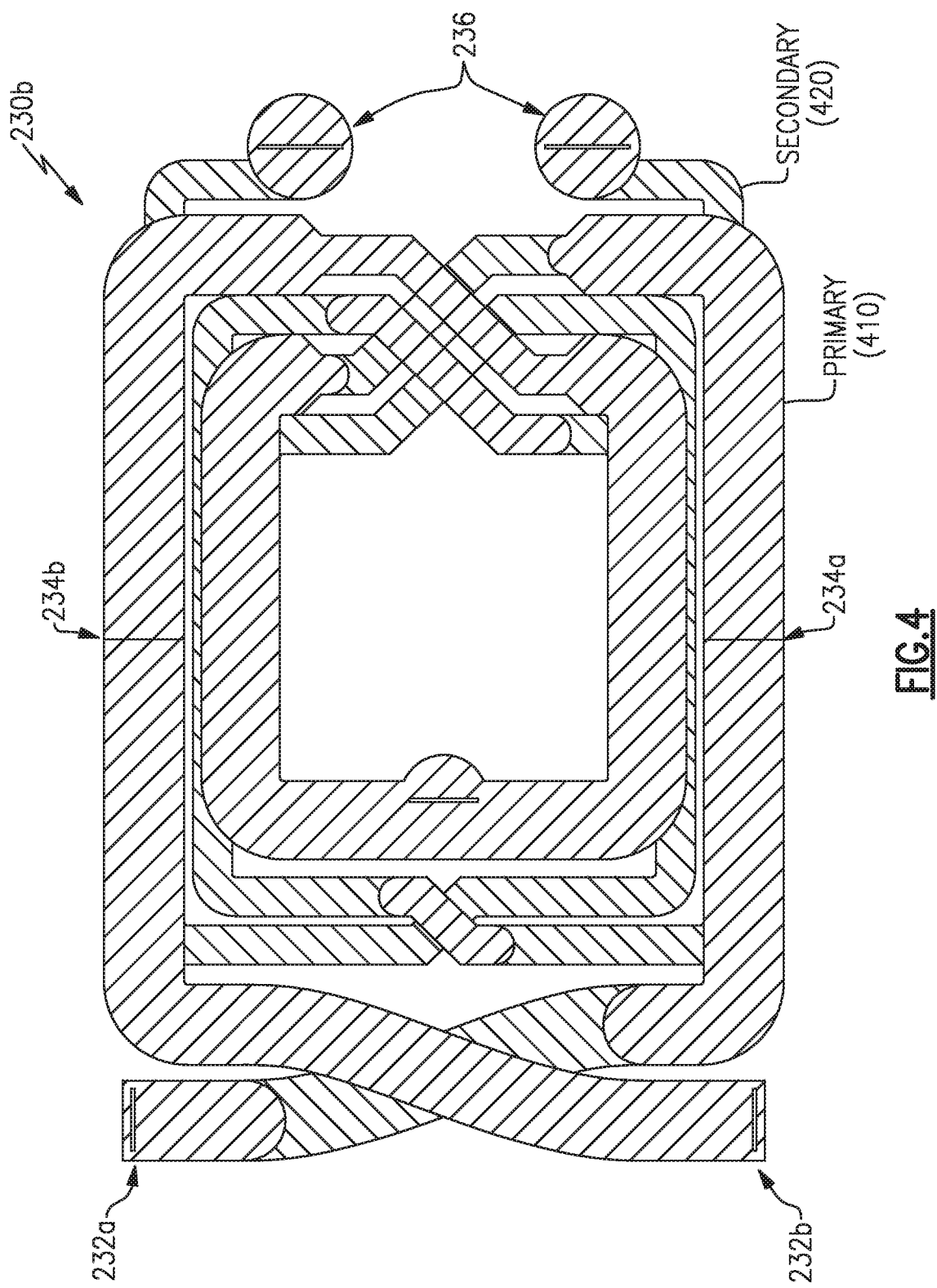
FIG. 4 is a schematic diagram of another example of a dual-mode balun converter for coupling balanced signal input to unbalanced signal output.

FIG. 4 illustrates another example of a multi-input balun 230b. The balun 230b is similar to the balun 230a and includes a primary section 410 and a secondary section 420. The balun 230b is configured with secondary inputs at a varying location, as compared to the balun 230a. The primary section 410 receives a transmit signal at one of a first set of inputs 232 or a second set of inputs 234, and electromagnetically couples the transmit signal to the secondary section 420 to provide an output signal at an output 236. For example, the first set of inputs 232, including 232a and 232b, may be coupled to outputs of the output stage 216 that support the first, e.g., LTE, mode of operation, and the second set of inputs 234, including 234a and 234b, may be coupled to outputs of the output stage 226 that support the second, e.g., 2G, mode of operation.

Figure 5:
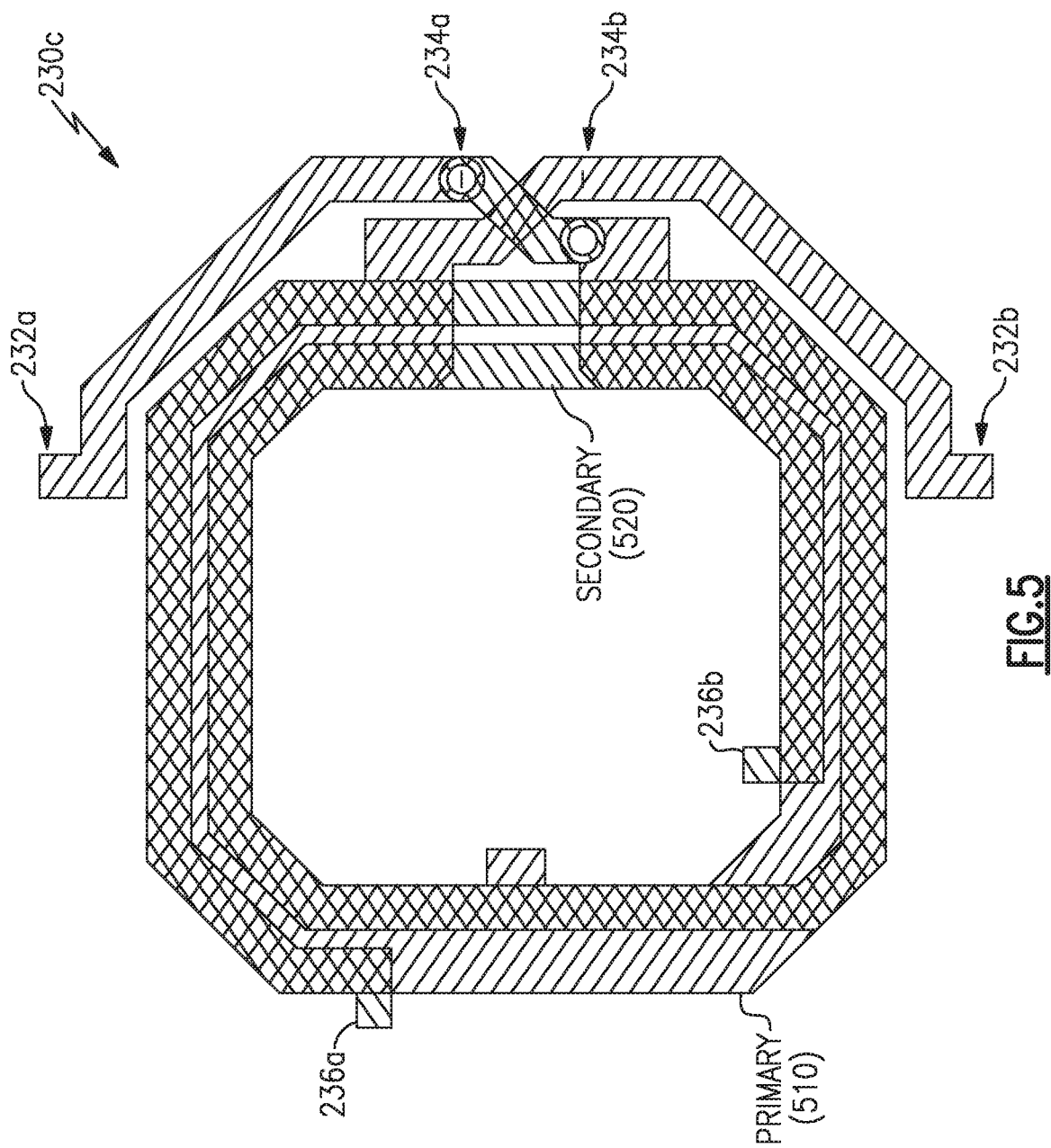
FIG. 5 is a schematic diagram of another example of a dual-mode balun converter for coupling balanced signal input to unbalanced signal output.

FIG. 5 illustrates another example of a multi-input balun 230c. The balun 230c is similar to the baluns 230a, 230b and includes a primary section 510 and a secondary section 520. The balun 230c may be an example suitable for manufacture as a laminate assembly. The primary section 510 receives a transmit signal at one of a first set of inputs 232 or a second set of inputs 234, and electromagnetically couples the transmit signal to the secondary section 520 to provide an output signal at an output 236, including 236a and 236b. For example, the first set of inputs 232, including 232a and 232b, may be coupled to outputs of the output stage 216 that support the first, e.g., LTE, mode of operation, and the second set of inputs 234, including 234a and 234b, may be coupled to outputs of the output stage 226 that support the second, e.g., 2G, mode of operation.

In various embodiments, the locations of the second set of inputs 234 and the first set of inputs 232 to a dual-mode balun may be selected or positioned at various points, and may be determined by various electromagnetic modeling and/or testing to determine enhanced or suitable arrangements for the various intended modes of operation, thereby accommodating changing performance requirements and differing applications. Accordingly, the positioning of the inputs as shown in the figures is illustrative.

Figure 6:
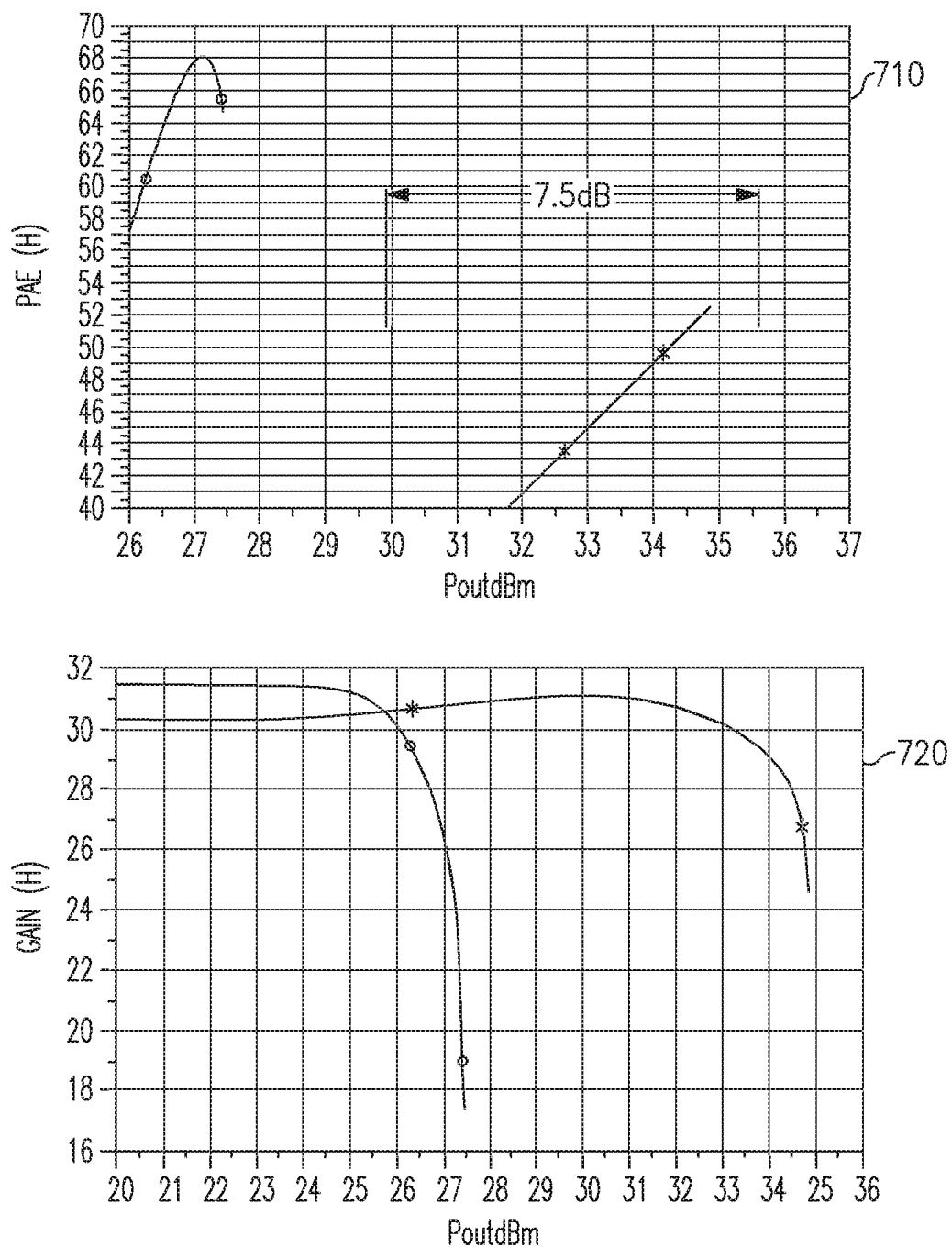
FIG. 6 is a set of graphs illustrating various simulated performance characteristics for an example power amplifier and balun arrangement.

FIG. 6 illustrates a number of simulated performance results for the system 200 operating in various 2G and 4G modes. The graphs 710 are plots of a power added efficiency (in %) of the amplifier 210 across a range of output power settings. The graphs 720 are plots of a gain (in dB) of the amplifier 210 across a range of output power settings. Each set of graphs is coded to indicate the performance is for a first, 4G LTE, mode of operation ('o'), or a second, 2G, mode of operation ('*') that selectively includes the matching section 260.

Embodiments of amplifier arrangements as described herein can be implemented in a variety of different modules including, for example, a stand-alone amplifier module, a coupler module, a front-end module, a module combining the amplifier arrangement with an antenna switching network, an impedance matching module, an antenna tuning module, or the like.

Modules may include a substrate and may include various dies and may include packaging, such as, for example, an overmold to provide protection and facilitate easier handling. An overmold may be formed over substrate and dimensioned to substantially encapsulate the various dies and components thereon. The module may further include connectivity from the amplifier arrangement or other components to the exterior of the packaging to provide signal interconnections, such as an input port connection, output port connection, coupled port connection, control input connection, etc. Certain examples may have multiple connections to accommodate access to various individual components in the module. The various connections may be provided in part by wirebonds or solder bumps, for example, and may include multiple electrical connections where appropriate.

Embodiments of the amplifier arrangements disclosed herein, optionally packaged into a module, may be advantageously used in a variety of electronic devices. Examples of the electronic devices can include, but are not limited to, consumer electronic products or components thereof, electronic test equipment, communications infrastructure (such as a base station, router, transmitter, etc.) and more. Specific examples of such electronic devices can include, but are not limited to, a mobile phone such as a smart phone, a tablet, a telephone, a modem, such as a cable modem or otherwise, a wireless router or access point, a camera, a digital camera, a portable memory chip, a vehicular electronics system such as an automotive electronics system or an avionics electronic system, a wrist watch, a clock, etc. Further, the electronic devices can include unfinished products.

General examples of an electronic device may include a circuit board having numerous modules mounted thereon. The circuit board may have multiple layers and may include circuit elements and interconnections in the layers and/or mounted on the surface of the circuit board. Each of the modules may have a multi-layer substrate within and upon which there may also be various circuit elements and interconnections. Additionally, the modules may further include dies, each of which may have multiple layers and include various circuit elements and interconnections. An amplifier arrangement in accord with aspects and embodiments disclosed herein may be implemented within, among, or across any of the layers of the various structures, e.g., circuit board, substrates, and dies, as part of an electronic device, such as a cell phone, tablet, smart device, router, cable modem, wireless access point, etc.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only.

What is claimed is:

1. An amplifier system comprising:
    at least one common amplifier stage having an input to receive a radio-frequency signal and to provide a common amplified radio-frequency signal;
    a first amplifier stage having an input to receive the common amplified radio-frequency signal during a first mode of operation and to provide a first amplified radio-frequency signal in a first frequency band;
    a second amplifier stage having an input to receive the common amplified radio-frequency signal during a second mode of operation and to provide a second amplified radio-frequency signal in a second frequency band;
    a passive signal coupler including a balanced primary section and an unbalanced secondary section, the balanced primary section having at least one first input to receive the first amplified radio-frequency signal from the first amplifier stage during the first mode of operation and at least one second input to receive the second amplified radio-frequency signal from the second amplifier stage during the second mode of operation.

2. The amplifier system of claim 1 wherein the unbalanced secondary section of the passive signal coupler includes a common output, and the passive signal coupler is configured to provide the first amplified radio-frequency signal to the common output during the first mode of operation and to provide the second amplified radio-frequency signal to the common output during the second mode of operation.

3. The amplifier system of claim 2 wherein the at least one first input of the balanced primary section of the passive signal coupler includes a first contact and a second contact to receive the first amplified radio-frequency signal.

4. The amplifier system of claim 3 wherein the at least one second input of the balanced primary section of the passive signal coupler includes a third contact and a fourth contact to receive the second amplified radio-frequency signal.

5. The amplifier system of claim 1 wherein the at least one first input of the balanced primary section of the passive signal coupler presents a first impedance to the first amplifier stage and the at least one second input of the balanced primary section of the passive signal coupler presents a second impedance to the second amplifier stage, the second impedance being different than the first impedance.

6. The amplifier system of claim 2 wherein the unbalanced secondary section of the passive signal coupler provides the first and second amplified radio-frequency signals to the common output as unbalanced signals.

7. The amplifier system of claim 2 further comprising a first matching network coupled to the common output.

8. The amplifier system of claim 7 further comprising a switch having an input and a plurality of outputs, the plurality of outputs including at least a first output and a second output, wherein the first matching network is coupled between the common output and the input of the switch.

9. The amplifier system of claim 8 further comprising a second matching network coupled to the second output of the switch, wherein the input of switch is selectively coupled to the first output of the switch during the first mode of operation, and wherein the input of the switch is selectively coupled to the second output of the switch and the second matching network during the second mode of operation.

10. The amplifier system of claim 1 wherein the first and second amplifier stages are selectively enabled based on the mode of operation.

11. An amplifier system comprising:
a first amplifier stage to provide a first balanced signal during a first mode of operation, the first balanced signal having a first frequency in a first frequency band;
a second amplifier stage to provide a second balanced signal during a second mode of operation, the second balanced signal having a second frequency in a second frequency band; and
a passive signal coupler including a balanced primary section and an unbalanced secondary section, the balanced primary section having at least one first input to receive the first balanced signal and at least one second input to receive the second balanced signal, and the unbalanced secondary section to convert the first balanced signal to a first unbalanced signal during the first mode of operation and to convert the second balanced signal to a second unbalanced signal during the second mode of operation.

12. The amplifier system of claim 11 wherein the first frequency band and the second frequency band are non-overlapping.

13. The amplifier system of claim 11 further comprising at least one common amplifier stage, coupled to the first amplifier stage and the second amplifier stage, to provide a radio frequency signal to the first amplifier stage and the second amplifier stage during the first mode of operation and the second mode of operation.

14. The amplifier system of claim 11 wherein the first input of the balanced primary section of the passive signal coupler includes a first contact and a second contact to receive the first balanced signal and to present a first impedance to the first amplifier stage.

15. The amplifier system of claim 14 wherein the second input of the balanced primary section of the passive signal coupler includes a third contact and a fourth contact to receive the second balanced signal and to present a second impedance to the second amplifier stage, the second impedance being different than the first impedance.

16. The amplifier system of claim 11 wherein the unbalanced secondary section of the passive signal coupler including a common output to provide the first unbalanced signal during the first mode of operation and to provide the second unbalanced signal to the common output during the second mode of operation.

17. The amplifier system of claim 16 further comprising a first matching network coupled to the common output.

18. The amplifier system of claim 17 further comprising a switch having an input and a plurality of outputs, the plurality of outputs including at least a first output and a second output, wherein the first matching network is coupled between the common output and the input of the switch.

19. The amplifier system of claim 18 further comprising a second matching network coupled to the second output of the switch, wherein the input of the switch is selectively coupled to the first output of the switch during the first mode of operation, and wherein the input of the switch is selectively coupled to the second output of the switch and the second matching network during the second mode of operation.

20. The amplifier system of claim 11 wherein the first and second amplifier stages are selectively enabled based on the mode of operation.

21. A method for controlling an amplifier system having an input and an output, the method comprising:
receiving a signal at the input;
amplifying the signal in at least one common amplifier stage to produce an amplified signal;
further amplifying, in a first amplifier stage, the amplified signal during a first mode of operation to provide a first balanced signal in a first frequency band to a first input of a balanced primary section of a passive signal coupler;
further amplifying, in a second amplifier stage, the amplified signal during a second mode of operation to provide a second balanced signal in a second frequency band to a second input of the balanced primary section of the passive signal coupler, the second amplifier stage being different than the first amplifier stage; and
converting, via an unbalanced secondary section of the passive signal coupler, the first balanced signal to a first unbalanced signal during the first mode of operation and the second balanced signal to a second unbalanced signal during the second mode of operation.

22. The method of claim 21 further comprising adjusting an output impedance at a common output of the unbalanced secondary section of the passive signal coupler by a first amount and providing one of the first and second unbalanced signals from the common output to at least one switched output of a plurality of switched outputs.

23. The method of claim 22 further comprising switchably providing the first unbalanced signal to a first switched output of the plurality of switched outputs during the first mode of operation and switchably providing the second unbalanced signal to a second switched output of the plurality of switched outputs during the second mode of operation.

24. The method of claim 23 further comprising adjusting the output impedance of the unbalanced secondary section of the passive signal coupler at the common output by a second amount by providing an additional impedance at the second switched output.

25. The method of claim 21 further comprising disabling the second amplifier stage during the first mode of operation and disabling the first amplifier stage during the second mode of operation.

* * * * *